(12) United States Patent
Chen et al.

(10) Patent No.: US 12,237,179 B2
(45) Date of Patent: Feb. 25, 2025

(54) FITTINGS FOR WAFER CLEANING SYSTEMS

(71) Applicant: Taiwan Semiconductor Manufacturing Company, Hsinchu (TW)

(72) Inventors: Cheng-Ping Chen, Taichung (TW);
Ping-Shen Chou, Hsinchu (TW);
Tsung-Lung Lai, Hsinchu (TW);
Ching-Wen Cheng, Zhubei (TW);
Chun Yan Chen, Zhubei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 392 days.

(21) Appl. No.: 17/671,664

(22) Filed: Feb. 15, 2022

(65) Prior Publication Data
US 2023/0051164 A1 Feb. 16, 2023

Related U.S. Application Data

(60) Provisional application No. 63/232,276, filed on Aug. 12, 2021.

(51) Int. Cl.
*B08B 1/12* (2024.01)
*F16L 23/024* (2006.01)
*H01L 21/67* (2006.01)

(52) U.S. Cl.
CPC .......... *H01L 21/67046* (2013.01); *B08B 1/12* (2024.01); *F16L 23/024* (2013.01)

(58) Field of Classification Search
CPC ... F16L 23/024; F16L 23/028; F16L 23/0283; F16L 23/0286; F16L 19/00; F16L 19/02; F16L 19/025; F16L 41/00; F16L 41/001; F16L 41/004; F16L 41/005; F16L 41/008; F16L 49/00; F16L 49/04; F16L 49/06; B08B 1/32
USPC ................................ 285/192, 193, 201, 205
See application file for complete search history.

(56) References Cited

U.S. PATENT DOCUMENTS

| | | | |
|---|---|---|---|
| 1,632,042 A * | 6/1927 | Price et al. | E03C 1/042 |
| | | | 285/193 |
| 7,963,572 B2 * | 6/2011 | Bull | F16L 15/009 |
| | | | 285/354 |

* cited by examiner

*Primary Examiner* — Aaron M Dunwoody
(74) *Attorney, Agent, or Firm* — Lippes Mathias LLP

(57) ABSTRACT

A fitting for an upper brush in a double brush scrubbing chamber of a wafer cleaning system is disclosed. The fitting includes a base plate, a flanged pipe, and a threaded connector. The base plate includes a threaded hole with a stop surface therein and a channel extending from the stop surface through a lower surface of the base plate. The flanged pipe is inserted into the base plate such that the flange at the top end of a hollow tube rests on the stop surface and the hollow tube passes through the channel of the base plate. The threaded connector has a passage therethrough, and engages the threaded hole of the base plate to fix the flanged pipe in place. This structure is able to provide fluid while minimizing particle generation.

20 Claims, 12 Drawing Sheets

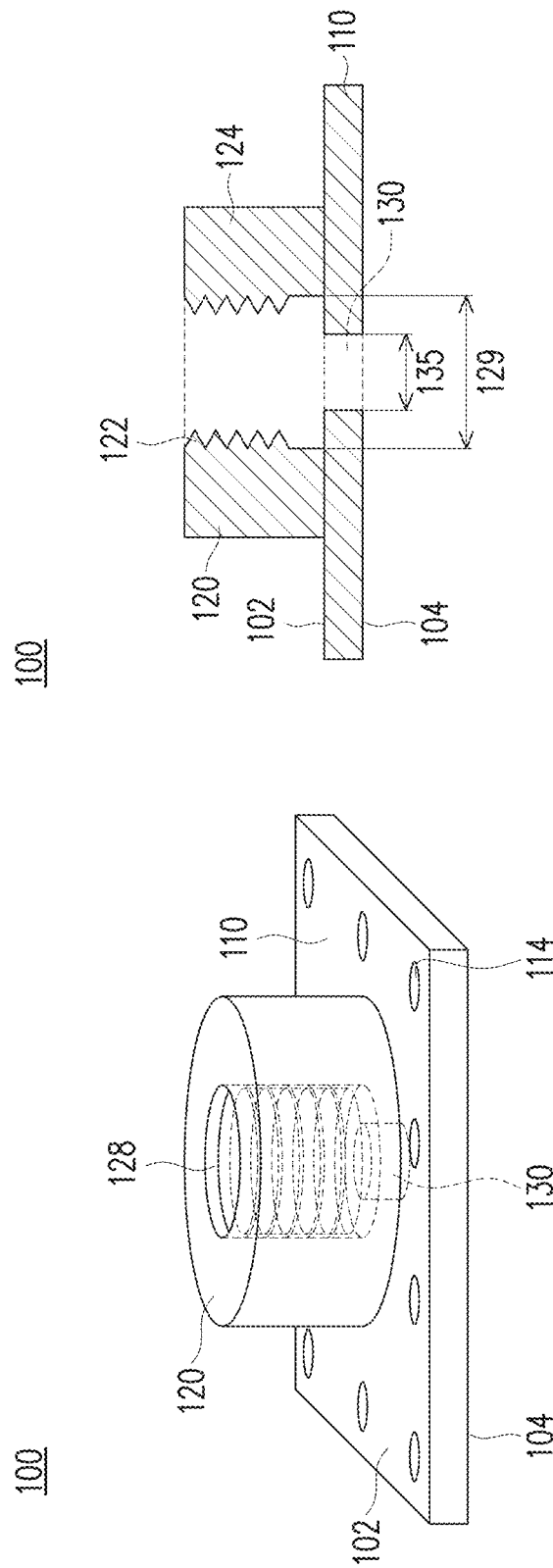

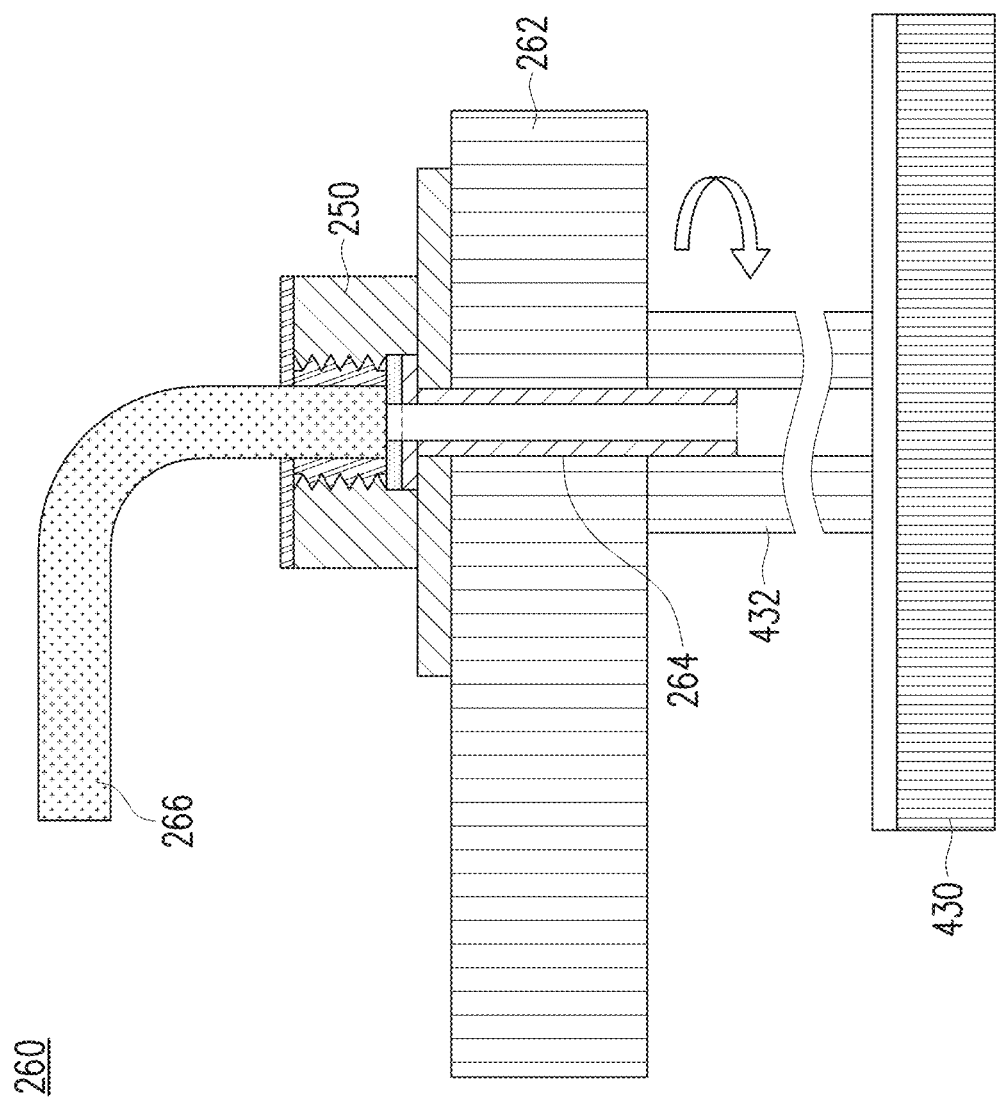

FITTINGS FOR WAFER CLEANING SYSTEMS

PRIORITY CLAIM AND CROSS-REFERENCE

This application claims priority to U.S. Provisional Patent Application Ser. No. 63/232,276, filed on Aug. 12, 2021, which is incorporated by reference in its entirety.

BACKGROUND

Integrated circuits are formed on a semiconductor wafer. Photolithographic patterning processes use ultraviolet light to transfer a desired mask pattern to a photoresist on a semiconductor wafer. The pattern is then etched into the layer below the photoresist. These steps are repeated multiple times with different patterns to build different layers on the wafer substrate and make a useful device.

With each layer becoming thinner, each processing step is more sensitive to the surface roughness of the layer beneath. Thus, "re-leveling" of the wafer surface has become needed after one layer is applied and before the next layer is deposited. This re-leveling operation is referred to as planarizing, and is done using a chemical-mechanical-planarization or chemical-mechanical-polishing (CMP) process. After a CMP process step, the surface of the wafer must be cleaned to remove particles generated by CMP.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-4B are various views of components of a fitting for an upper brush in a scrubbing chamber of a wafer cleaning system. The fitting comprises a base plate, a flanged pipe, and a threaded connector.

FIG. 1A is a perspective view of the base plate used in the fitting, and FIG. 1B is a side cross-sectional view of the base plate, in accordance with some embodiments of the present disclosure.

FIG. 4B is a side cross-sectional view of the fitting with the components joined together.

FIG. 5 is a cross-sectional schematic diagram illustrating one end of an upper arm, showing how the fitting of FIG. 4A and FIG. 4B is used, in accordance with some embodiments.

DETAILED DESCRIPTION

Figure 2B:
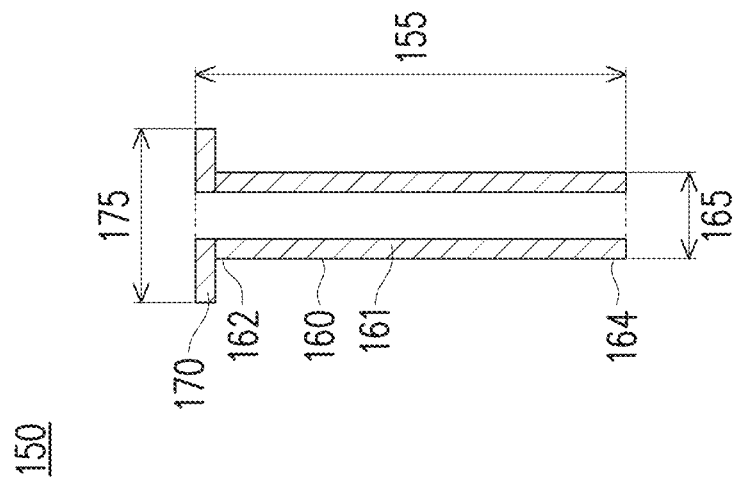
FIG. 2B is a side cross-sectional view of the flanged pipe, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure relates to wafer cleaning systems, particularly those that include an upper brush that is intended to clean the top surface of the semiconducting wafer substrate. The upper brush is usually suspended below an upper arm, which can move vertically and may also move horizontally as well. Washing fluids, such as deionized water and/or other chemical agents (e.g. dilute hydrofluoric acid), are sprayed upon the upper brush or the wafer substrate, and the top surface is scrubbed by the upper brush to remove particles generated by an upstream process. However, the structure and construction of the upper brush, the arm, and the other components of the cleaning system itself can also generate particles. In particular, when constructed using interference fitting, steel pipes can shift position when loose and can fall and contact the upper brush itself. This creates particles which can then fall onto the integrated circuits present on the wafer substrate, causing damage and the need to scrap wafer dies.

Figure 2A:
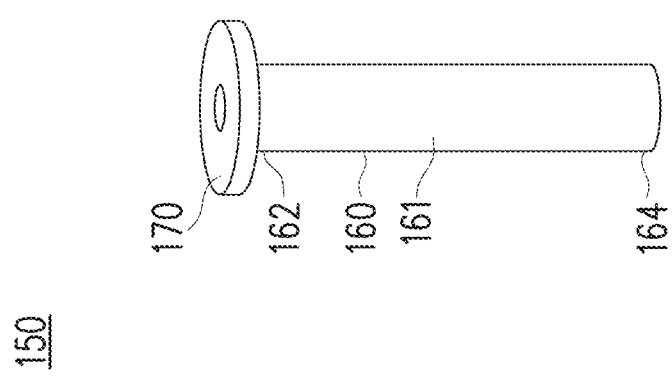
FIG. 2A is a perspective view of the flanged pipe used in the fitting.
Figure 3B:
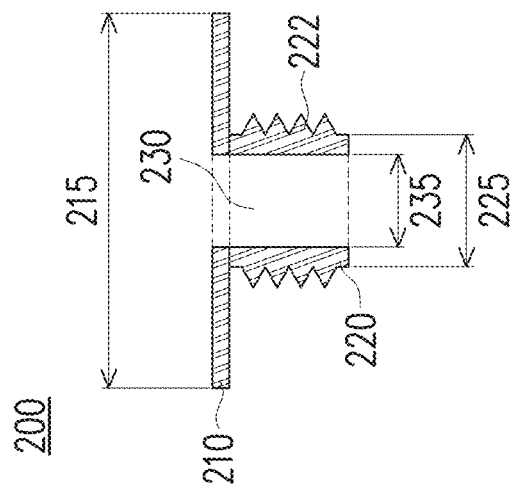
FIG. 3B is a side cross-sectional view of the threaded connector, in accordance with some embodiments.

FIGS. 1A-3B are various views of components of a fitting for an upper brush in a scrubbing chamber of a wafer cleaning system. The fitting comprises a base plate, a flanged pipe, and a threaded connector. FIG. 1A is a perspective view of the base plate, and FIG. 1B is a side cross-sectional view of the base plate, in accordance with some embodiments of the present disclosure. FIG. 2A is a perspective view of the flanged pipe, and FIG. 2B is a side cross-sectional view of the flanged pipe, in accordance with some embodiments. FIG. 3A is a perspective view of the threaded connector, and FIG. 3B is a side cross-sectional view of the threaded connector, in accordance with some embodiments.

Referring first to FIG. 1A and FIG. 1B, the base plate 100 can be described as being formed from a lower plate 110 and an upper well 120 which is located concentrically above the lower plate. However, the base plate is usually made as a single integral piece. As illustrated here, the lower plate has a square shape while the upper well has a cylindrical shape, but they may have any desired shape.

The lower plate 110 is generally flat, i.e. has a constant thickness in the area not bounded by the upper well 120. The lower plate 110 includes a plurality of openings 114 about its perimeter, which are used to fasten the base plate to an upper arm within the wafer cleaning system. Generally, any number of openings may be used as desired, and they may be placed in any location about the perimeter as desired. Here, eight openings 114 are illustrated as being in two rows on opposite sides of the lower plate. Other arrangements, such as four openings in each corner of the lower plate, are also contemplated.

The upper well 120 defines a threaded hole 128 in the base plate. A stop surface 126 is present at the bottom of the upper well, which could also be considered as being the part of the upper surface 102 of the lower plate 110 which is surrounded by the upper well. The upper well can also be described as being formed from a cylindrical sidewall 124 having an internal thread 122. A channel 130 also extends from the stop surface 126 through the base plate to a lower surface 104 of the base plate. The channel has a diameter 135 which is less than the diameter 129 of the threaded hole 128. The channel does not contain an internal thread.

The base plate 100 is made of suitable materials which desirably are not corroded by exposure to liquids such as water and/or acids. Some non-limiting materials from which the base plate can be made include steel, polyether ether ketone (PEEK), polypropylene, polyvinyl chloride (PVC), or glass. In particular embodiments, the base plate is made of steel.

Referring next to FIG. 2A and FIG. 2B, the flanged pipe 150 may also be called an umbrella pipe, due to its side profile. The flanged pipe 150 comprises a hollow tube 160 defined by a cylindrical sidewall 161, such that fluid can flow through the entire flanged pipe. The hollow tube 160 has a top end 162 and a bottom end 164. The flanged pipe 150 also comprises a flange 170 at the top end 162 of the hollow tube, which is formed from a projecting collar. Desirably, the flange is solid, or in other words does not have any holes passing through it. Fluid can flow through the flanged pipe from the top end to the bottom end. The flanged pipe has a length 155. In some particular embodiments, the length 155 is from about 5 centimeters (cm) to about 11 cm.

The flange has a diameter 175, and the bottom end 164 of the hollow tube has a diameter 165. The diameter 175 of the flange is greater than the diameter 165 of the bottom end of the hollow tube. In particular embodiments, the diameter 175 of the flange is from 0 up to about 27 millimeters (mm). The diameter of the hollow tube is generally constant throughout its length.

Comparing the flanged pipe of FIG. 2A and FIG. 2B with the base plate of FIG. 1A and FIG. 1B, the diameter 129 of the threaded hole is greater than or equal to the diameter 175 of the flange. The diameter 175 of the flange is greater than the diameter 135 of the channel of the base plate. The diameter 135 of the channel of the base plate is equal to or greater than the diameter 165 of the bottom end of the hollow tube.

Like the base plate, the flanged pipe should be made of materials which desirably are not corroded by exposure to liquids such as water and/or acids. Again, some examples of such materials include steel, PEEK, polypropylene, PVC, and glass. In particular embodiments, the flanged pipe is made of steel.

Figure 3A:
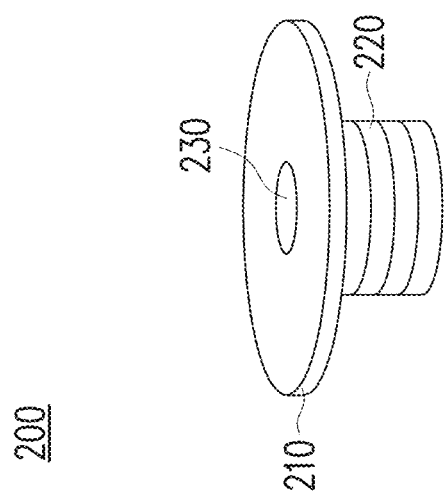
FIG. 3A is a perspective view of the threaded connector used in the fitting.

Referring now to FIG. 3A and FIG. 3B, the threaded connector can also be called a T-shaped connector, due to its side profile. The threaded connector 200 includes a head 210 and a shaft 220. A passage 230 runs through the head and the shaft, so that fluid can flow through the threaded connector. The shaft 220 also has an external thread 222. The head has a diameter 215, the shaft has a diameter 225, and the passage has a diameter 235. The diameter 215 of the head is greater than the diameter 225 of the shaft, which is greater than the diameter 235 of the passage. In some embodiments, the threaded connector is a size M10 to size M18 connector (i.e. has a diameter of 10 mm to 18 mm). The threaded connector is usually made of polytetrafluoroethylene, a rubber, or steel.

Comparing the threaded connector of FIG. 3A and FIG. 3B with the base plate of FIG. 1A and FIG. 1B, the diameter 215 of the head is greater than the diameter 129 of the threaded hole. The diameter of the passage 235 in the threaded connector is desirably equal to or greater than the diameter 135 of the channel of the base plate. Comparing the threaded connector of FIG. 3A and FIG. 3B with the flanged pipe of FIG. 2 and FIG. 2B, the diameter of the passage 235 in the threaded connector is desirably equal to or greater than the diameter 165 of the hollow tube 160 of the flanged pipe.

Figure 4B:
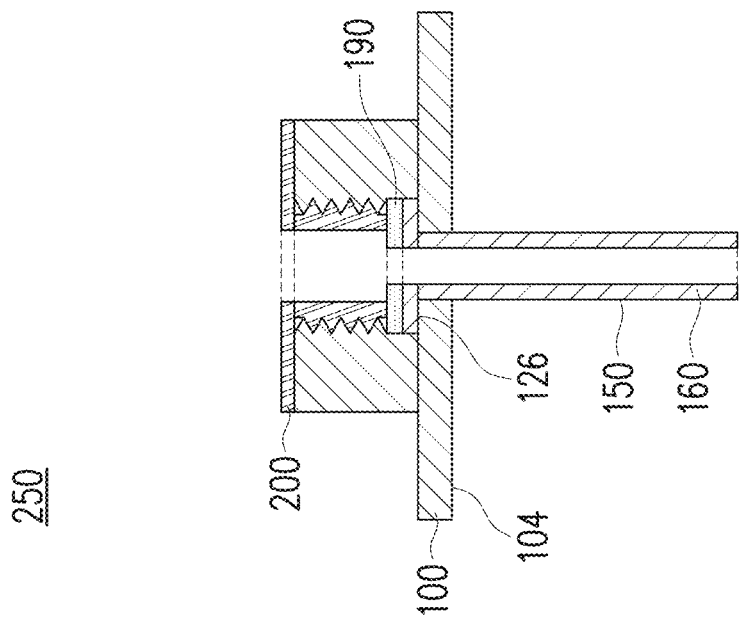
Figure 4A:
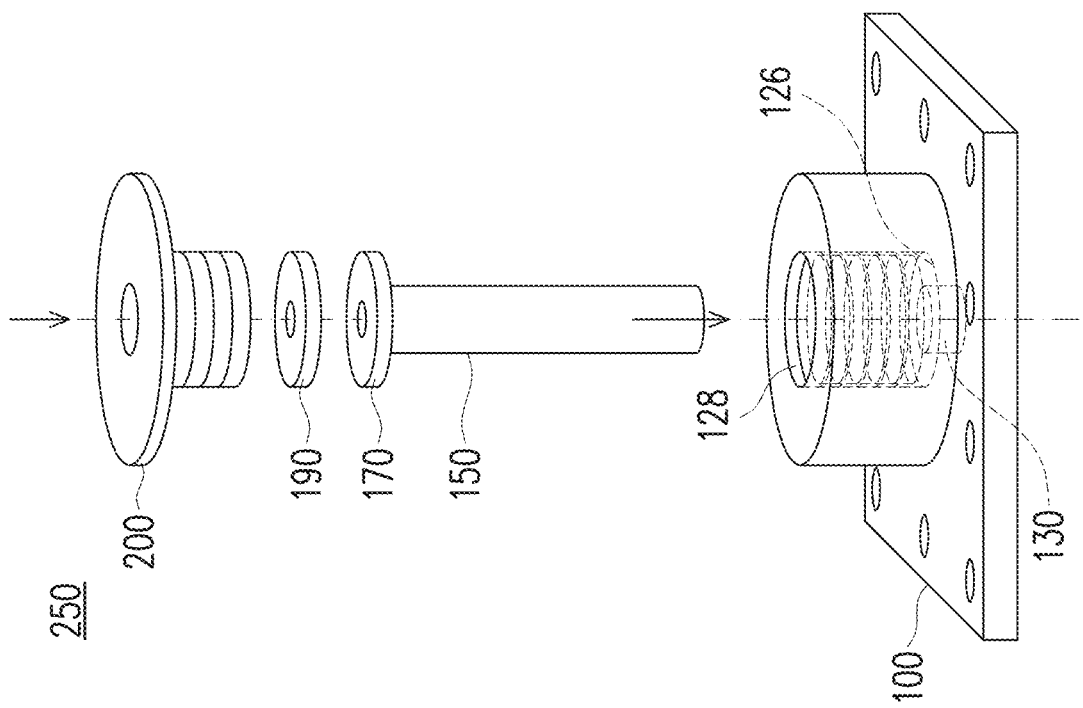
FIG. 4A is an exploded view of the components of the fitting.
Figure 6:
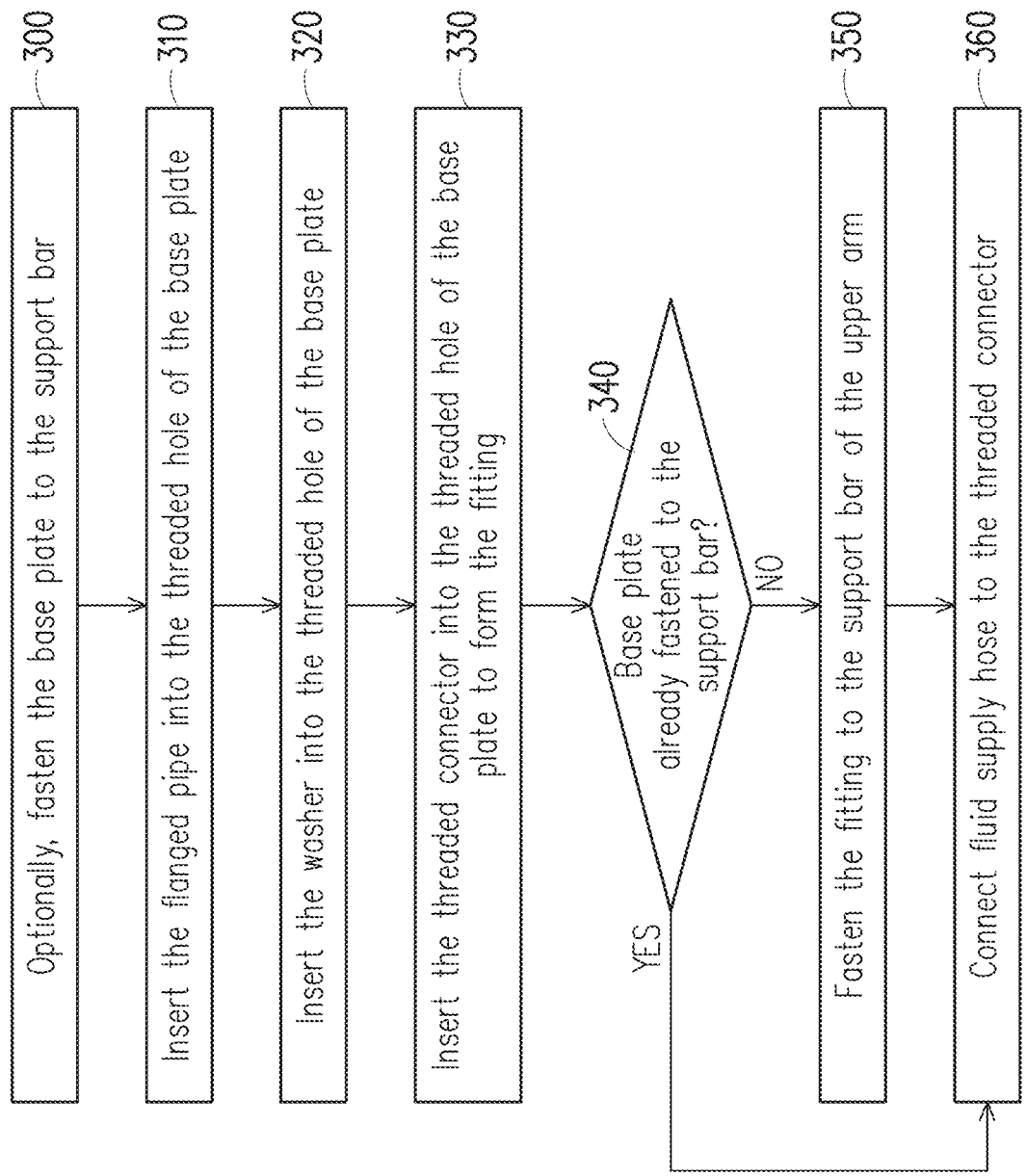
FIG. 6 is a flow chart showing method steps for making or assembling an upper arm that uses the fitting, in accordance with some embodiments.

Continuing, FIG. 4A is an exploded view of the components of the fitting 250. FIG. 4B is a side cross-sectional view of the fitting with the components joined together. FIG. 5 is a magnified cross-sectional schematic diagram illustrating one end of an upper arm 260 to which the upper brush 430 is attached, showing how the fitting of FIG. 4A and FIG. 4B is used. FIG. 6 is a flow chart showing method steps for making or assembling the fitting 250 and the upper arm 260, which can be better understood by referring to FIG. 4A, FIG. 4B, and FIG. 5.

Referring first to FIG. 4A and FIG. 6 together, in step 310, the flanged pipe 150 is inserted into the threaded hole 128 of the base plate 100. The flange 170 rests against the stop surface 126. The hollow tube 160 of the flanged pipe passes through the channel 130 of the base plate, and extends out of the lower surface 104 of the base plate. Next, in step 320, a washer 190 is inserted into the threaded hole 128 to sit upon the flange 170. Next, in step 330, the threaded connector 200 is inserted into the threaded hole 128, with the external thread engaging the internal thread in the threaded hole to fix the flanged pipe 150 in place. The resulting fitting 250 is best seen in FIG. 4B.

Referring now to FIG. 5, the fitting 250 is fastened to a surface of a support bar 262 of the upper arm 260, through the openings of the base plate. The surface can be internal to the arm or an external surface of the arm. The flanged pipe passes through a shaft 264 of the upper arm and out the other side of the support bar. The flanged pipe rests within a rotatable shaft 432 to which the upper brush 430 is attached. The fitting 250 itself is fixed in place, and does not rotate with the shaft 432. A fluid supply pipe or hose 266 is attached to the fitting 250. The pipe or hose is fed from a fluid source (not shown), which can provide any liquid, such as a washing fluid or other chemical agents. The fluid flows through the shaft 432 to the upper brush 430. The context and function of the upper arm is also discussed further herein.

Referring now to FIG. 5 and FIG. 6 together, in step 350, the fitting 250 is fastened to the support bar 262 of the upper arm In step 360, a fluid supply pipe or hose 266 is connected to the threaded connector 200. Referring back to FIG. 4A, the fluid can thus flow through the fitting through the passage 230 of the threaded connector 200, through the hollow tube 160, and out the bottom end 164 of the flanged pipe 150.

It is noted that either the fitting 250 can first be assembled and then fastened to the support bar 262, or the base plate 100 can first be fastened to the support bar 262 and the other components then inserted into the base plate. This choice is also indicated in FIG. 6 as steps 300 and 340.

The upper brush and upper arm are used in the scrubbing chamber of a wafer cleaning system. In this regard, in chemical-mechanical-planarization or chemical-mechanical-polishing (CMP), a slurry or solution containing abrasive particles is dispensed onto a brush or the wafer substrate. Relative movement between the brush and the wafer substrate induces mechanical and chemical effects on the surface of the wafer substrate. This process creates a highly level surface on the wafer. To remove the slurry and the abrasive particles, as well as to remove other small surface defects, a post-CMP cleaning step is required.

Such a post-CMP cleaning step can be carried out using a wafer cleaning system that includes rotating scrubber brushes. When actuated, the rotational movement of the brushes, along with a washing fluid, cleans one or both sides of the wafer substrate using contact pressure against the surface(s) of the wafer substrate.

Figure 7:
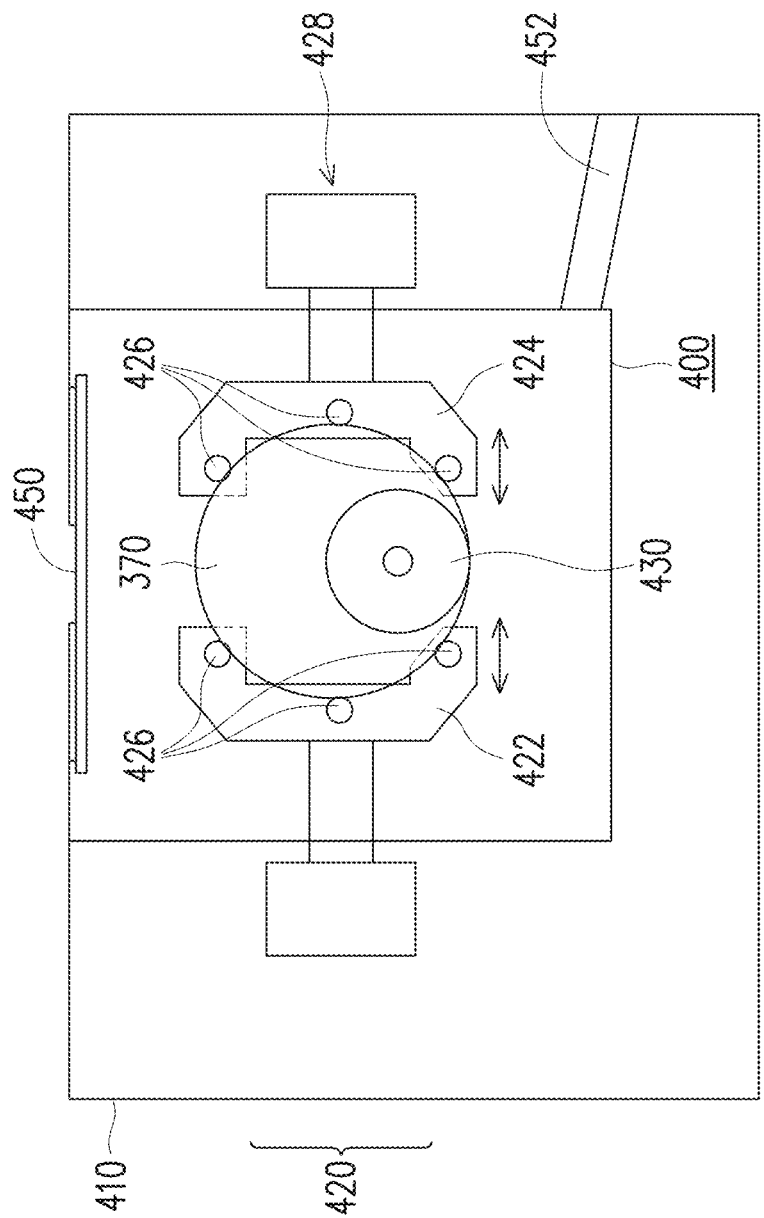
FIG. 7 is a plan view of a schematic diagram for a double-sided brush scrubbing chamber using the fitting and the upper arm, in accordance with some embodiments.
Figure 8:
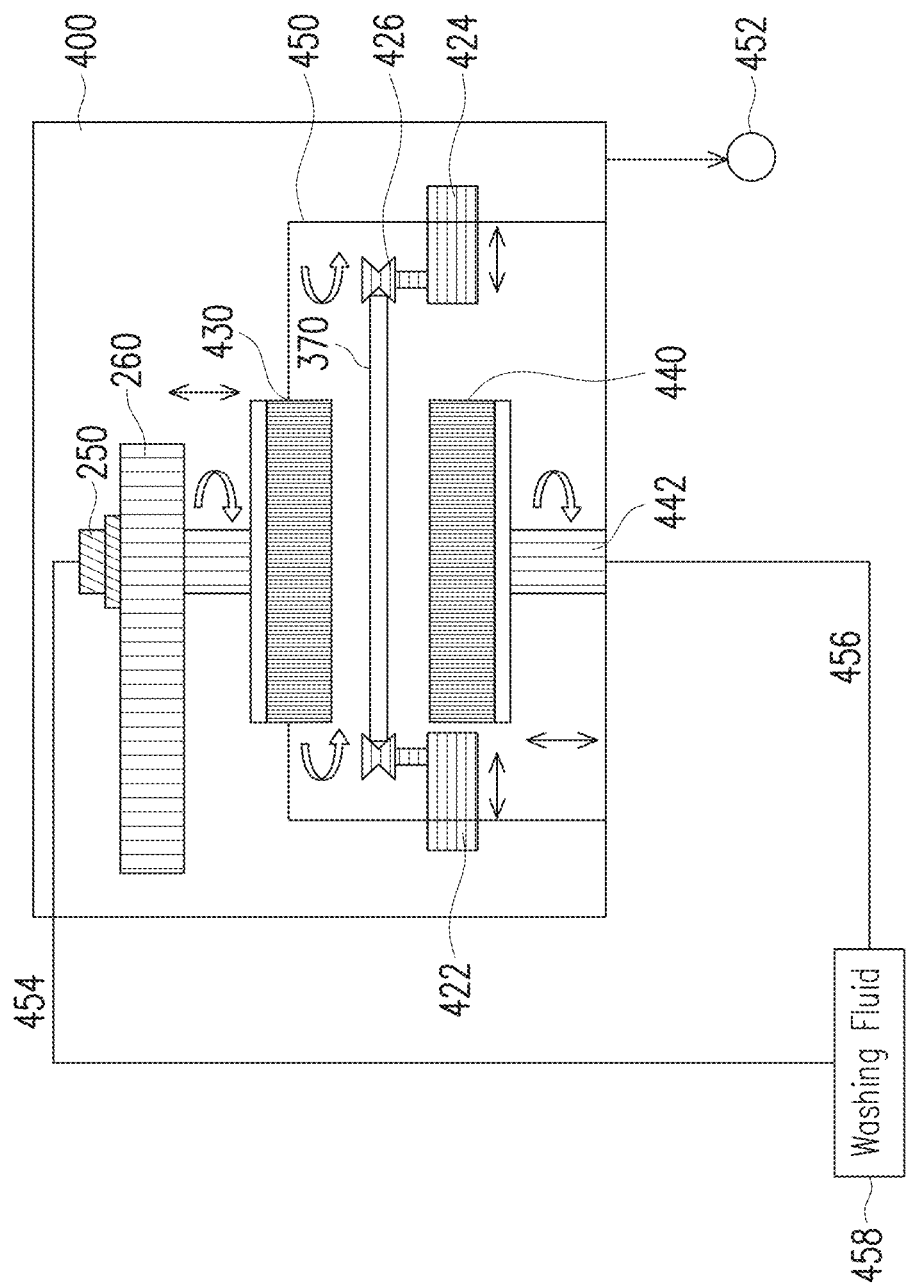
FIG. 8 is a side cross-sectional schematic diagram of the double-sided brush scrubbing chamber of FIG. 7.

FIG. 7 is a plan view of a schematic diagram for a double-sided brush scrubbing chamber 400 which is part of a wafer cleaning system, and which contains the improved upper brush design and upper arm of the present disclosure. FIG. 8 is a side cross-sectional schematic diagram of the double-sided brush scrubbing chamber.

Referring first to FIG. 7, the double-sided brush scrubbing chamber is contained within a housing 410. The scrubbing action occurs within the chamber 400 to control exposure to fluids. A wafer retention device 420 comprising a pair of retention arms 422, 424 is disposed on opposite sides of the chamber. Each retention arm has three wafer retention rollers 426 thereon, spaced apart. The circumference or perimeter of the wafer 370 is held by each wafer retention roller 426. The retention arm is shaped, and the rollers are spaced apart, such that the rollers are generally disposed about the circumference of the wafer. The retention arms 422, 424 are also movable toward and away from each other, so as to move between a first state where the wafer 370 is held by the wafer retention rollers 426, and a second state where the wafer 370 is released by the wafer retention rollers 426. The retention arms 422, 424 are within the chamber, while their controls and motors 428 are outside the chamber (though within the housing).

During the wafer cleaning process, the wafer 370 is rotated about its vertical axis. This is done by driving the rotation of one or more of the wafer retention rollers 426, which in turn spins the wafer. In particular embodiments, all six of the wafer retention rollers are rotatively driven, as this permits rotation of the wafer in the most stable manner.

Continuing, only the upper brush 430 is visible in FIG. 7, since the lower brush 440 is below the upper brush. The upper brush 430 is attached to the upper arm 260, which moves the upper brush 430 between a first state where the upper brush can clean the wafer, and a second state where the upper brush is moved out of the way so that the wafer can be placed into the chamber or removed from the chamber. In some embodiments, for example where the wafer is inserted from the side, the upper arm only needs to move vertically (i.e. up-and-down). In some embodiments where the wafer is inserted from the top, the upper arm can move vertically and can also move horizontally, so as to be able to move the upper brush out of the way.

Also illustrated is a door 450 on one side of the housing (not the top) through which the wafer can be inserted or removed from the chamber 400. Finally, a drain pipe 452 is shown, which is used for draining fluids from the chamber 400.

Referring now to FIG. 8, as indicated, the two wafer retention arms 422, 424, move back-and-forth horizontally. In a first position, the wafer retention arms are retracted against the walls of the chamber and do not contact the semiconducting wafer substrate. This permits a wafer to be inserted into or removed from the chamber through the door 450 (in and out of the plane of the page), usually upon a robotic transfer arm (not shown). In the second position as illustrated here, the wafer retention arms 422, 424 move towards the center of the chamber, so that the perimeter of the wafer is engaged by the wafer retention rollers 426 and held in place. The robotic transfer arm could then be lowered and then retracted out the door.

The upper arm 260 is shown here with fitting 250. The upper brush 430 and the lower brush 440 are located above and below a wafer holding position where the wafer 370 is held in place by the wafer retention device 420. The brushes themselves can be made of a suitable material, for example polyvinyl alcohol (PVA). The upper brush is adapted to be rotatively driven about its vertical axis, and can also be moved up-and-down vertically. Similarly, the lower brush 440 is adapted to be driven rotatively about its vertical axis, and can also be moved up-and-down vertically. The lower brush 440 is fixed in place and does not move horizontally (when viewed from above, as in the plan view of FIG. 7). In some embodiments, the upper arm 260 does not move horizontally. In other embodiments, the upper arm can also be moved horizontally.

The scrubbing/cleaning of the top and bottom surfaces of the wafer 370 is performed by rotating the upper brush 430 and the lower brush 440 with the wafer in between. As previously noted, the wafer 370 is also rotated. The upper brush 430 and the lower brush 440 are located off-center from the center of the wafer 370. In addition, the upper brush 430 and lower brush 440 each has a diameter greater than the radius of the wafer 370. As a result, the combination of rotations permits the entire surface area on both surfaces of the wafer to be scrubbed/cleaned. The wafer 370 typically rotates at a speed of up to about 20 rpm. The brushes 430, 440 typically rotate at a speed of up to 1,000 rpm.

Continuing, the shafts 432, 442 to which the upper brush 430 and the lower brush 440 are connected respectively, rotate to provide motion to the brushes. In addition, the shafts are hollow, through which washing fluids are supplied to the brushes. Washing fluid is supplied to the shafts 432, 442 via fluid supply pipes 454, 456 from a washing fluid source 458. Thus, the top and bottom surfaces of the wafer 370 are scrubbed while being supplied with washing fluid.

Figure 9:
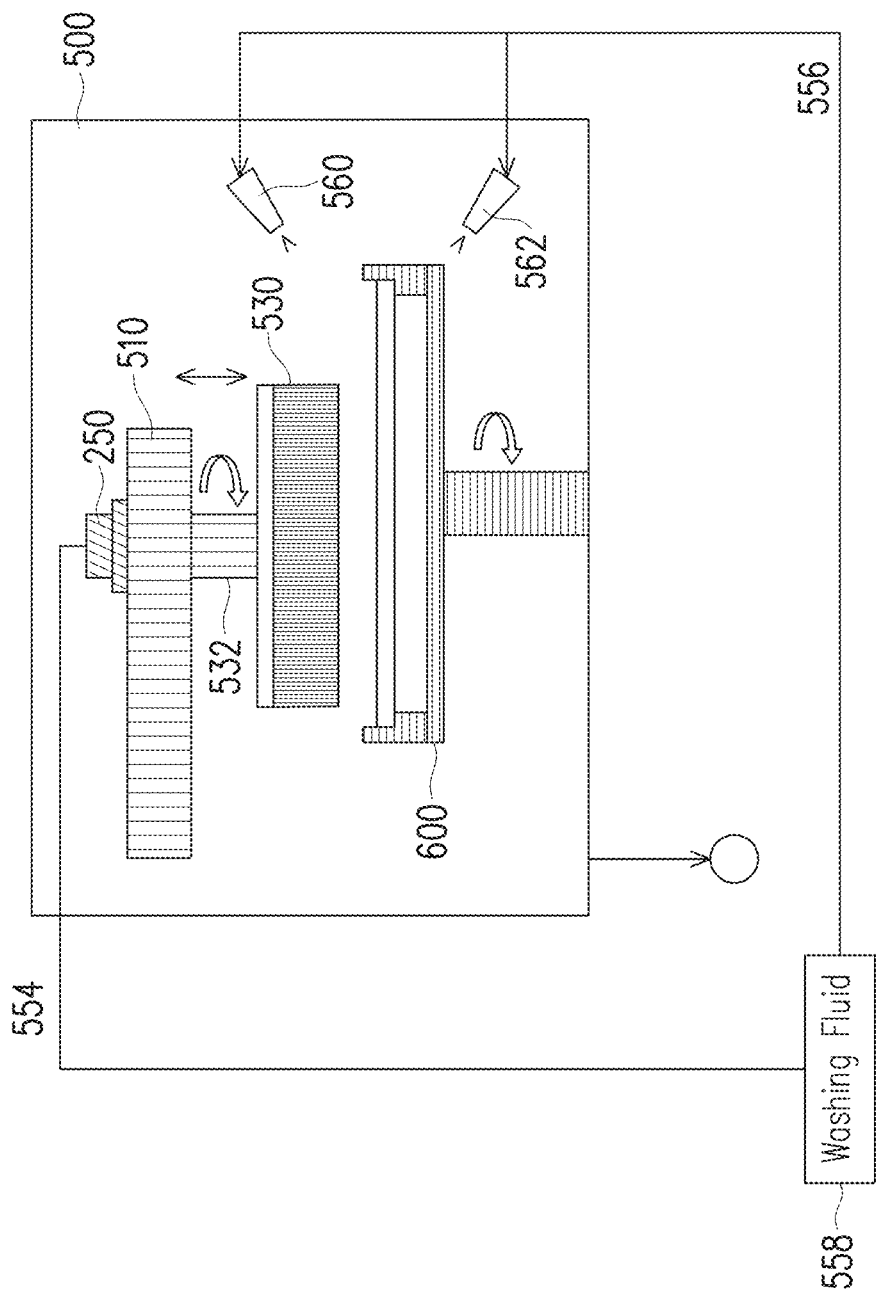
FIG. 9 is a side cross-sectional schematic diagram of a top brush scrubbing chamber using the fitting and the upper arm, in accordance with some embodiments.

FIG. 9 is a side cross-sectional schematic diagram for a top brush scrubbing chamber 500 which is also part of a wafer cleaning system, and which can also contain the improved upper brush design and fitting that is illustrated in FIG. 5.

The top brush scrubbing chamber 500 includes a wafer holding assembly 600 that holds the wafer 370 in place. The circumference or perimeter of the wafer 370 is held by the wafer holding assembly 600. During the top surface cleaning process, the wafer holding assembly 600 rotates about its vertical axis, which in turn spins the wafer.

The top brush scrubbing chamber 500 also includes an upper arm 510 to which an upper brush 530 is attached. Fitting 250 is also illustrated here. The upper arm and the upper brush have the same dimensions, and can operate in the same manner, as the upper arm 260 in the double-sided brush scrubbing chamber 400 of FIG. 7 and FIG. 8. For example, the upper arm may be fixed in place, or may also be able to move horizontally.

Washing fluid is supplied to the shaft 532 of the upper arm 510 via fluid supply pipe 554 from washing fluid source 558. Also illustrated here are an upper nozzle 560 and a lower nozzle 562, which also receive fluid via fluid supply pipe 556 from washing fluid source 558. These two nozzles can also be used to supply the washing fluid towards the top surface and the bottom surface of the wafer.

Figure 10:
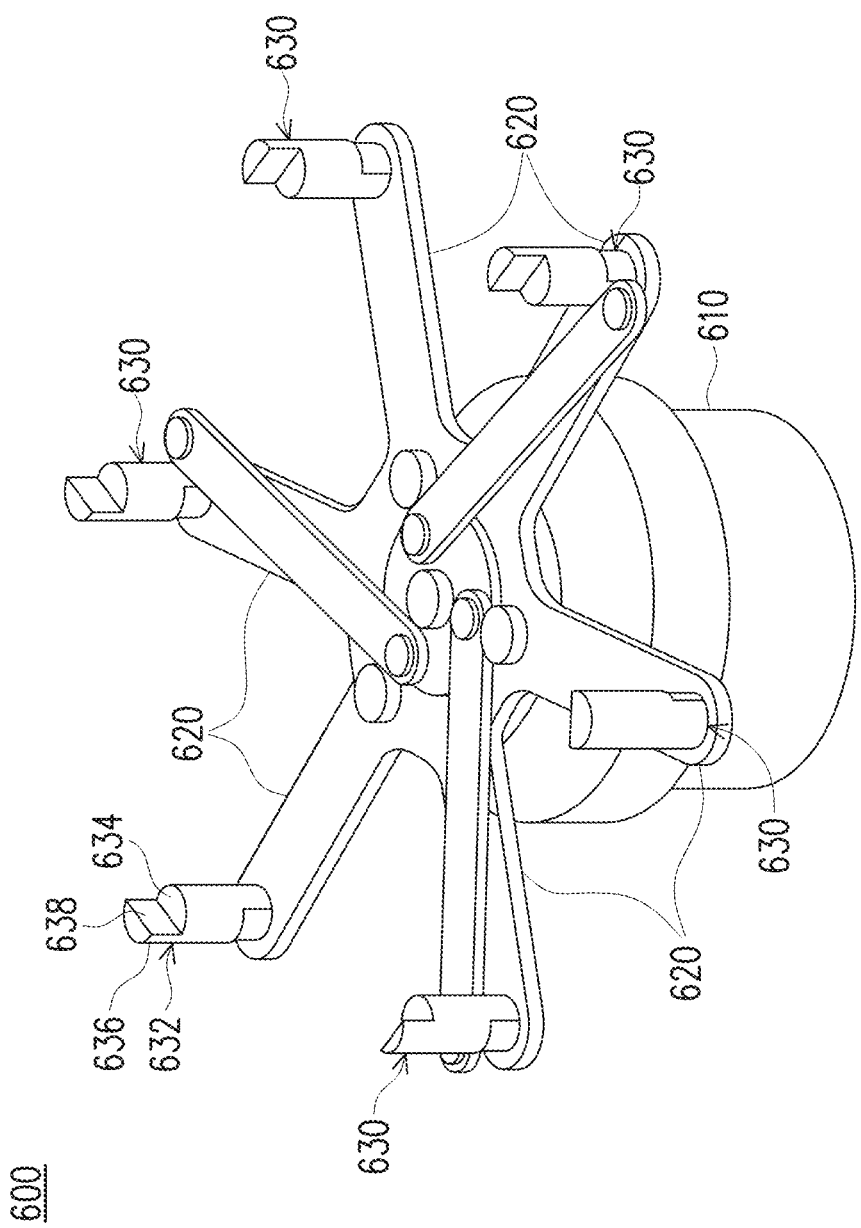
FIG. 10 is a perspective view of a different wafer holding assembly that is used with the top brush scrubbing chamber, in accordance with some embodiments.

FIG. 10 is a perspective view of the wafer holding assembly 600 that can be used in the top brush scrubbing chamber, since there is no lower brush that needs to access the bottom surface of the wafer. The wafer holding assembly 600 includes a rotatable chuck base 610 with multiple chuck arms 620 extending outwards from the center. Here, six arms are shown. A wafer retention pin 630 extends upward at the distal end of each chuck arm. Each chuck pin 630 comprises a pin body 632 that defines a horizontal wafer support surface 634. A wafer catch finger 636 extends upward beyond the wafer support surface 634 and provides a vertical wafer engaging surface 638. In use, the wafer rests upon the wafer support surfaces 634, with the wafer engaging surfaces 638 holding the wafer in place as the chuck base 610 rotates the wafer underneath the upper brush.

Figure 11B:
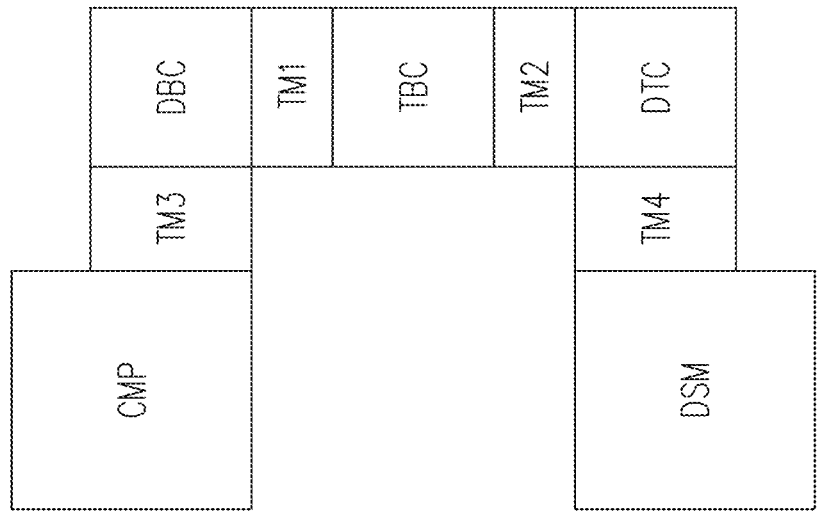
FIG. 11B is a plan view schematic diagram of a second example of a wafer cleaning system, in accordance with some embodiments.
Figure 11A:
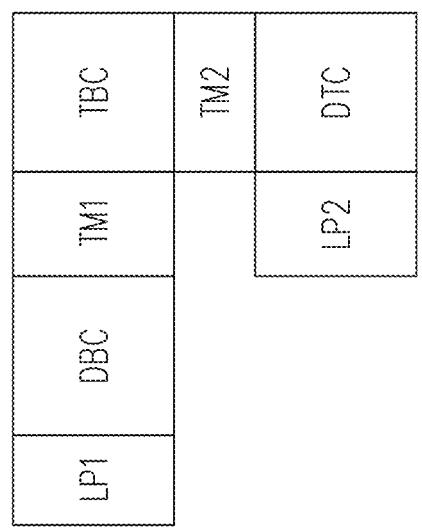
FIG. 11A is a plan view schematic diagram of a first example of a wafer cleaning system, in accordance with some embodiments.

The double-sided brush scrubbing chamber of FIG. 7 and FIG. 8 and the top brush scrubbing chamber of FIG. 9 are part of a wafer cleaning system 700, an example of which is schematically illustrated in FIG. 11A. Generally, after the CMP process, the wafer is cleaned and dried using the wafer cleaning system. Typically, there are three main stages in the cleaning system: a scrubbing and cleaning of both sides/surfaces of the wafer in a double sided brush scrubbing chamber, a second scrubbing and cleaning of the top surface of the wafer in a top surface brush scrubbing chamber, and rinsing/drying of the wafer in a dry task chamber.

A semiconducting wafer substrate passes through the system 700 starting at load port LP1. A Front Opening Unified Pod (FOUP) is used to store and/or transport one or more such wafer substrates between various workstations, including the wafer cleaning system. The load port LP1 is part of an Equipment Front End Module (EFEM), and receives a FOUP containing the wafer substrates to be cleaned. The EFEM is typically in the form of a housing that includes one or more load ports configured in accordance with the FIMS (front-opening interface mechanical standard), to receive a FOUP and access the contents thereof while protecting the contents from contaminants. The housing includes a filter fan unit (FFU) that provides laminar gas flow to the interior environment of the housing, with the downward flow of air blowing contaminants out of the interior to maintain a clean environment to protect the wafer substrates. The EFEM also contains an automated material handling system (AMHS) for moving the wafer substrates from the FOUP to the double-sided brush scrubbing chamber DBC. This chamber is configured as described above for cleaning both sides of the wafer substrate.

Next, a first transfer module TM1 contains an AMHS that transfers the wafer from the double-sided brush scrubbing chamber DBC to a top surface brush scrubbing chamber TBC. This chamber TBC cleans only the top surface of the wafer (and does not clean the bottom surface again). Again, its structure is very similar to the double-sided chamber DBC as described above, except no lower brush is present and so a different wafer holding assembly can be used.

A second transfer module TM2 transfers the wafer from the top surface brush scrubbing chamber TBC to a dry task chamber DTC. The dry task chamber DTC also contains a wafer holding assembly that rotates to dry off the wafer substrate. in addition, the chamber DTC may also contain an ultrasonic cleaning device that operates together with a cleaning fluid to clean off the wafer substrate again. The chamber DTC may also contain a gas drying device that sprays an inert gas (e.g. nitrogen, $N_2$) upon the wafer substrate during rotation of the wafer holding assembly, to enhance drying. It is possible to perform the drying function of the dry task chamber DTC in the top surface brush scrubbing chamber TBC, if desired. In such embodiments, the second transfer module TM2 and the dry task chamber TBC would be omitted from the wafer cleaning system 700.

Continuing then, finally, the wafer substrate passes from the dry task chamber DTC to a second load port LP2. Again, the load port LP2 is part of an Equipment Front End Module (EFEM) and contains an AMHS for transferring the wafer substrate from the DTC to a FOUP. The wafer substrate can then be transported to a subsequent manufacturing process.

In other embodiments, instead of using a load port LP1, the wafer cleaning system 700 can be connected to an upstream system using a transfer module. Similarly, the wafer cleaning system 700 can also be connected to a subsequent downstream system using a transfer module. FIG. 11B is a schematic illustration of an example wafer cleaning system connected in such a manner. Each module is as described with reference to FIG. 11A. In addition, for example, the upstream system is a CMP system, labeled CMP. A third transfer module TM3 moves a wafer substrate from the upstream system CMP to the double-sided brush scrubbing chamber DBC. A fourth transfer module TM4 moves the wafer substrate from the dry task chamber DTC to a downstream module DSM for further processing.

Figure 12:
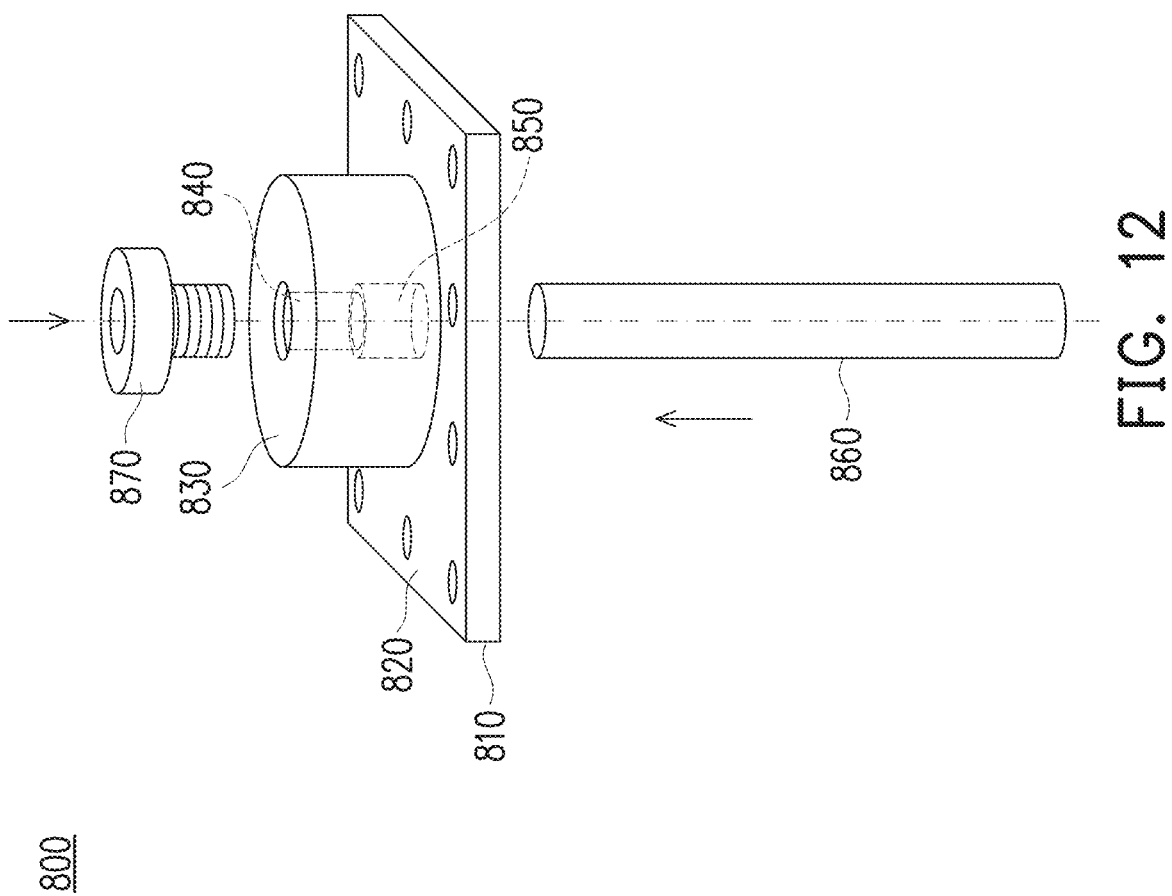
FIG. 12 is an exploded view of a comparative fitting in some embodiments, for comparison with the fitting of FIG. 4A.

For comparative purposes, FIG. 12 illustrates a comparative fitting 800 for performing the same functions as the fitting of FIG. 4A and FIG. 4B. The comparative fitting includes a base plate 810, a hollow pipe 860, and a threaded connector 870. The base plate 810 can also be described as including a lower plate 820 and an upper well 830. A threaded hole 840 and channel 850 are also present in the base plate. Here, the hollow pipe 860 does not have flanges on either side. The fitting is made by inserting the pipe 860 upwards into the channel 850 of the base plate. The pipe is held in the channel by press fitting or an interference fit, where the two parts are held together by friction. The threaded connector 870 is screwed into the threaded hole 840 of the base plate, and is used to engage a fluid supply pipe or hose.

However, the interference fit of the comparative fitting can loosen, permitting the hollow pipe 860 of FIG. 12 to fall and contact the brush or other components. This can generate particles which can then fall onto the top surface of the wafer, damaging the integrated circuits formed thereon and resulting in scrapping of the wafer dies. This also creates downtime as the problem is fixed, and increases overhead due to the need for an engineer to troubleshoot the problem. In contrast, the present fitting described in FIG. 4A and FIG. 4B cannot fall due to the presence of the flange 170, which reduces the generation of particles by almost 100%. In addition, reduced particle generation lowers the number of wafer dies that must be scrapped due to damage in the double-sided brush scrubbing chamber DBC. It is estimated that scrap can be reduced by up to 25% due to use of the present fitting.

The fittings of the present disclosure can also be used in different systems. For example, although the fitting described above is described in relation to a system for performing a cleaning process on a wafer substrate, the fitting may generally be applicable to any system or process in which a fluid is dispensed upon a wafer substrate from above. Such systems may include, for example, those for performing a development process for developing a resist film on a substrate after light exposure, a coating process for coating a substrate with a resist, a heat-treatment process for heating or cooling a substrate, and the like. Those processes can also be performed on any other type of substrate, such as rectangular glass substrates for liquid crystal display devices.

It is noted that although the discussion herein may be in the context of a post-CMP cleaning, the discussion applies to generally any cleaning process that may be performed upon a semiconducting wafer substrate. Thus, the washing fluid may be any suitable fluid used to clean the wafer or any layers thereon. Examples of fluids used in cleaning processes may include deionized water (DIW) and dilute hydrofluoric acid (DHF). An RCA clean can also be performed. This may include multiple different fluids. For example, SC-1 is a solution of DIW, ammonia, and hydrogen peroxide, which can be used to remove organic residues as well as particles. SC-2 is a solution of DIW, hydrochloric acid, and hydrogen peroxide which can remove metallic contaminants and form a thin passivating layer on the wafer surface. Piranha solution is a solution of sulfuric acid and hydrogen peroxide. Acetone, methanol, and/or trichloroethylene may also be used to remove various impurities.

Some embodiments of the present disclosure thus relate to fittings for an upper brush in a double brush scrubbing chamber of a wafer cleaning system. The fittings comprise a base plate, a flanged pipe, and a threaded connector. The base plate comprises a threaded hole with a stop surface therein. A channel extends from the stop surface through a lower surface of the base plate. The flanged pipe comprises a hollow tube and a flange at a top end of the hollow tube. The flanged pipe is inserted into the base plate such that the flange rests on the stop surface and the hollow tube passes through the channel of the base plate. The threaded connector has a passage therethrough. The threaded connector engages the threaded hole of the base plate to fix the flanged pipe in place.

Other embodiments of the present disclosure relate to methods of assembling an upper arm for an upper brush. A flanged pipe is inserted into a threaded hole of a base plate such that a flange of the flanged pipe rests on a stop surface of the base plate and so that a hollow tube of the flanged pipe passes through a channel of the base plate and out a lower surface of the base plate. A threaded connector is inserted into the threaded hole to fix the flanged pipe in place. The base plate is fastened to a support bar either before or after the flanged pipe and threaded connector are inserted.

Also disclosed in various embodiments are methods for cleaning a wafer surface in a double brush scrubbing chamber of a post-CMP wafer cleaning system. A washing fluid is provided through the fitting described herein. The flanged pipe is fixed in place and cannot contact an upper brush within the double brush scrubbing chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer cleaning system, comprising:
a brush scrubbing chamber having an upper brush that is attached to a rotatable shaft of an upper arm; and
a fitting attached to a support bar of the upper arm, the fitting comprising:
a base plate comprising a threaded hole with a stop surface therein and a channel extending from the stop surface through a lower surface of the base plate;
a flanged pipe comprising a hollow tube and a flange at a top end of the hollow tube, inserted into the base plate such that the flange rests on the stop surface and the hollow tube passes through the channel of the base plate and into the rotatable shaft; and
a threaded connector having a passage therethrough, the threaded connector engaging the threaded hole of the base plate to fix the flanged pipe in place;
wherein the flanged pipe cannot contact the upper brush.

2. The system of claim 1, further comprising a liquid source configured to provide liquid through the passage of the threaded connector and the hollow tube of the flanged pipe.

3. The system of claim 1, further comprising a washer between the flanged pipe and the threaded connector.

4. The system of claim 1, wherein the hollow tube of the flanged pipe has a length of about 5 cm to about 11 cm.

5. The system of claim 1, wherein the flange of the flanged pipe has a diameter that is greater than a diameter of a bottom end of the hollow tube.

6. The system of claim 1, wherein the flange of the flanged pipe has a diameter of up to about 27 mm.

7. The system of claim 1, wherein the flanged pipe is made of steel, polyether ether ketone (PEEK), polypropylene, polyvinyl chloride (PVC) or glass.

8. The system of claim 1, wherein the threaded connector is made of polytetrafluoroethylene, a rubber, or steel.

9. A method of assembling an upper arm for an upper brush, comprising:
- inserting a flanged pipe into a threaded hole of a base plate such that a flange of the flanged pipe rests on a stop surface of the base plate and so that a hollow tube of the flanged pipe passes through a channel of the base plate and out a lower surface of the base plate;
- inserting a threaded connector into the threaded hole to fix the flanged pipe in place;
- fastening the base plate to a support bar.

10. The method of claim 9, further comprising connecting a pipe from a fluid source to provide fluid through a passage of the threaded connector and the hollow tube of the flanged pipe.

11. The method of claim 9, further comprising inserting a washer into the threaded hole prior to inserting the threaded connector.

12. The method of claim 9, wherein the hollow tube of the flanged pipe has a length of about 5 cm to about 11 cm.

13. The method of claim 9, wherein the flange of the flanged pipe has a diameter that is greater than a diameter of a bottom end of the hollow tube.

14. The method of claim 9, wherein the flange of the flanged pipe has a diameter of up to about 27 mm.

15. The method of claim 9, wherein the flanged pipe is made of steel, polyether ether ketone (PEEK), polypropylene, polyvinyl chloride (PVC) or glass.

16. The method of claim 9, wherein the threaded connector is made of polytetrafluoroethylene, a rubber, or steel.

17. A method of cleaning a wafer surface in a scrubbing chamber of a wafer cleaning system, comprising:
- providing a washing fluid through a fitting comprising:
    - a base plate comprising a threaded hole with a stop surface therein and a channel extending from the stop surface through a lower surface of the base plate;
    - a flanged pipe comprising a hollow tube and a flange at an end of the hollow tube, inserted into the base plate such that the flange rests on the stop surface and the hollow tube passes through the channel of the base plate; and
    - a threaded connector having a hole therethrough, the threaded connector engaging the threaded hole to fix the flanged pipe in place;
- wherein the flanged pipe is fixed in place and cannot contact an upper brush within the double brush scrubbing chamber; and
- scrubbing the wafer surface with the upper brush.

18. The method of claim 17, wherein the hollow tube of the flanged pipe has a length of about 5 cm to about 11 cm.

19. The method of claim 17, wherein the flange of the flanged pipe has a diameter that is greater than a diameter of a bottom end of the hollow tube.

20. The method of claim 17, wherein the flange of the flanged pipe has a diameter of up to about 27 mm.

* * * * *